(12) United States Patent
Dawson

(10) Patent No.: US 6,775,804 B1
(45) Date of Patent: Aug. 10, 2004

(54) DETERMINING INTEGRITY OF A PACKET

(75) Inventor: John E. Dawson, Vancouver, WA (US)

(73) Assignee: Nortel Networks Limited, St. Laurent (CA)

( * ) Notice: Subject to any disclaimer, the term of this patent is extended or adjusted under 35 U.S.C. 154(b) by 458 days.

(21) Appl. No.: 09/723,388

(22) Filed: Nov. 28, 2000

(51) Int. Cl.[7] .................................... H03M 13/00
(52) U.S. Cl. ............................. 714/776; 714/781
(58) Field of Search ..................... 714/807, 819, 714/774, 751; 455/67.4; 370/249, 244; 375/285

(56) References Cited

U.S. PATENT DOCUMENTS

| | | | |
|---|---|---|---|
| 4,486,877 A | * 12/1984 | Turner | 370/249 |
| 4,894,718 A | * 1/1990 | Hung | 348/181 |
| 5,673,279 A | 9/1997 | Oskouy et al. | 371/67.1 |
| 5,787,094 A | 7/1998 | Cecchi et al. | 371/53 |
| 5,802,105 A | 9/1998 | Tiedemann, Jr. et al. | 375/225 |
| 6,038,000 A | 3/2000 | Hurst, Jr. | 348/845 |
| 6,067,303 A | 5/2000 | Aaker et al. | 370/474 |
| 6,481,012 B1 | 11/2002 | Gordon et al. | 725/54 |

OTHER PUBLICATIONS

U.S. patent application Ser. No. 09/723,835, Dawson, filed Nov. 28, 2000.

U.S. patent application Ser. No. 09/723,836, Dawson, filed Nov. 28, 2000.

\* cited by examiner

*Primary Examiner*—Albert Decady
*Assistant Examiner*—Mujtaba Chaudry
(74) *Attorney, Agent, or Firm*—Trop, Pruner & Hu, P.C.

(57) ABSTRACT

A test environment includes a test packet generator, a system under test, and a test device. The test packet generator generates test packets each containing a check value (e.g., a cyclic redundancy check value). The system under test performs a known transform of at least a portion of each test packet, and generates a new check value based on the transformed packet. The test device receives the transformed packets from the system under test. The test device performs an error check based on the check value and also compares the check value with an expected check value to validate the content of each received packet.

33 Claims, 16 Drawing Sheets

DETERMINING INTEGRITY OF A PACKET

TECHNICAL FIELD

The invention relates to determining integrity of a packet, such as a test packet for testing a network device.

BACKGROUND

Various different types of data networks exist that provide for many types of communications, such as electronic mail, file transfer, web browsing, text chat, and other exchanges of data. With the increased bandwidth and speed of data networks, communications of voice and other forms of real-time, interactive data have also become possible. Examples of the different types of data networks include local area networks (LANs), wide area networks (WANs), the Internet, and so forth.

Terminals and nodes coupled to a data network include various layers, such as layers according to the Open Systems Interconnect (OSI) model. The lowest layer (layer 1) is the physical layer, which is the actual electrical and mechanical interface to the transport medium. The next higher layer (layer 2) is referred to as the data link layer, which is responsible for delivery of information to the transport medium and for error checking the information. The next layer (layer 3) is referred to as the network layer, which is responsible for the switching and routing of the connection. Other layers are also part of the OSI model.

One example of a layer 2 protocol is the Ethernet protocol, with one version specified in the 802.3 Standard from the Institute of Electrical and Electronics Engineers (IEEE). One example of a layer 3 protocol is the Internet Protocol (IP).

An Ethernet frame includes a destination address, a source address, payload data, and a cyclic redundancy check (CRC) field (for error detection). The payload data of the Ethernet frame carries a layer 3 datagram, such as an IP datagram. An IP datagram also includes a protocol header and a payload. The IP header includes a source network address, a destination network address, control flags, a protocol field to indicate the next level protocol used in the payload of the IP datagram, a header checksum that is calculated based on the content of the IP header, and other information.

A data network includes a number of switches or routers to enable communication of data between endpoints. Packets that are communicated over the data networks contain addresses that are used by switches or routers to forward or route packets to the appropriate path for delivery to the destination When a switch or router is manufactured, it is run through a variety of tests. Many of these tests involve sending test packets from a test generator, with the test packets passed through the switch or router under test. The switch or router under test forwards the packets to a receiving test device, which determines if the packets contain errors or not. In conventional test systems designed for verifying some layer 2 switches, a simple check for CRC errors is usually sufficient to identify data corruption. Since many layer 2 switches do not change the contents of packets passing through the switches, the original CRC of the test packet remains unchanged as it passes through the system under test (assuming data corruption did not occur in the system under test). At the receiving end, the receiving test device can simply perform a CRC error detection to determine if data corruption has occurred.

At the transmitting end of every Ethernet system, the CRC value placed into a packet is calculated at the OSI data link layer based on the bit pattern of the Ethernet frame (including the source address, destination address, and payload). At the receiving end of every Ethernet system, the CRC of a received frame is re-calculated to check for errors in transmission. If any of the bits of the destination address, source address, or payload, changes value in transit, then the CRC check performed at the receiving end is designed to indicate that data corruption has occurred. The check at the receiving end is performed at the data link layer by concatenating the data pattern and the CRC bits, with the concatenated bit pattern divided by a preselected divisor polynomial P (which is also used at the transmitting end to generate the CRC bits). If the division produces no remainder (that is, the remainder is zero), then the CRC algorithm provides a reliable indication that no errors have occurred.

Although CRC checking is quick and easy to perform in hardware, and is relatively accurate with layer 2 switches that do not change the content of the test packet, such testing may be insufficient if the switch or router under test is capable of changing the content of test packets, such as the content of the IP header. Some layer 2 switches are able to modify contents of the IP header, such as to change type of service information or to add or change virtual local area network (VLAN) tags. A layer 3 switch or router almost always changes the content of the packet header. Usually the layer 3 switch or router changes the destination and source addresses in the header as well as recalculates a new checksum due to the change of the header. Another type of switch that may cause contents of packets to change is a switch including Asynchronous Transfer Mode (ATM) core device.

When the switch or router under test modifies the content of a packet, a new CRC value is calculated for the modified packet before the switch or router under test transmits the packet to the receiving test device. Thus, at the receiving test device, performance of the CRC error detection will merely indicate if the CRC value generated by the switch or router under test was correct for the data transmitted. The CRC protects against data corruption for the transport medium from the switch or router under test to the receiving test device. However, simple CRC checking at the receiving test device does not enable confirmation regarding whether the switch or router under test performed error-free processing of the packet. Even if the switch or router under test is defective and performs packet header transformations incorrectly, the CRC value calculated by the medium access control (MAC) module in the switch or router under test will still be correct, since the calculated CRC is based on the incorrect packet content. As a result, simple CRC checking does not enable verification of the content of the packet which has been processed by a switch or router under test.

A need thus exists for an improved testing apparatus and method.

SUMMARY

In general, according to one embodiment, a method of testing packets communicated over a network comprises receiving a packet having a check value based on content of the entire packet. Error detection is then performed using the check value of the received packet. Further, the check value of the received packet is compared with an expected check value.

Some embodiments of the invention may have one or more of the following advantages. Verification of test packet content can be performed in tests involving switches that are capable of transforming packet content, such as the header of the packet. The verification can be performed efficiently and at relatively high speed. In some arrangements, the verification of packet content can be performed at substantially wire speeds so that the switch can be tested at high packet transfer speeds.

Other features and advantages will become apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments may be possible.

Figure 1:
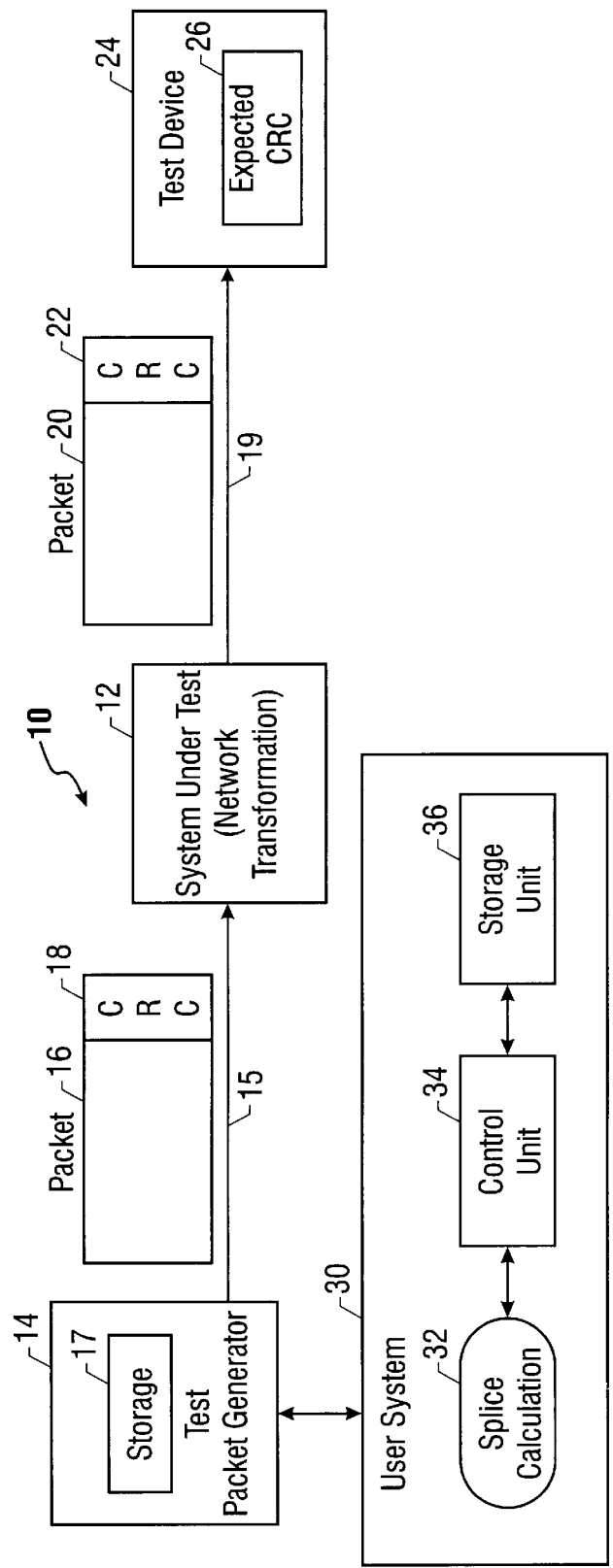
FIG. 1 is a block diagram of an embodiment of a test environment for testing a system under test.

Referring to FIG. 1, a test environment 10 includes a system under test 12, which can be a layer 2 or layer 3 switch or router, or a plurality of layer 2 or layer 3 switches and routers. In the ensuing description, reference is to a "switch" or "system under test." As used here, a "switch," or "system under test," refers to any device, or collection of devices, (layer 2, layer 3, or otherwise) that forwards a packet, datagram, or other unit of data based on predetermined parameters, such as addresses carried in the packet, datagram, or other unit of data, along one of various paths.

A test packet generator 14 generates test packets 16, which are transmitted to the system under test 12 over a link 15. In one example embodiment, the packet 16 is an Ethernet frame according to the 802.3 Standard from the Institute of Electrical and Electronics Engineers (IEEE). The Ethernet frame includes a cyclic redundancy check (CRC) field 18, which is calculated based on the entire content of the packet 16. The system under test 12 is one that is capable of performing a known network transformation on at least a portion of the packet 16. The transformation produces a packet 20, which has a CRC field 22 with a different value then the CRC field 18 due to the network transformation performed by the system under test 12.

The packet 20 is transmitted by the system under test 12 over a link 19 to a test device 24, which performs an error check based on the CRC value 22. In addition, in accordance with some embodiments of the invention, the test device 24 also compares the CRC value 22 with an expected CRC value 26 that is stored in the test device 24. The expected CRC value 26 can be pre-loaded into the test device, and represents the expected CRC of test packets 20 received by the test device 24. A successful comparison of the CRC value 22 in the received packet 20 with the expected CRC value 26 indicates that the system under test 12 has successfully performed its intended function. However, if the CRC value 22 does not match the expected CRC value 26, then a failure has occurred.

In one embodiment, the test device 24 counts the number of successfully received packets. A comparison can then be made between this count and the number of test packets transmitted by the test packet generator 14 to determine the percentage of packets that were communicated through the system under test 12. In effect, the expected CRC value 26 is used as a trigger to perform the count, with a match of the CRC field 22 and the expected CRC value 26 causing the count to increment.

In some embodiments, a single expected CRC value 26 is used, with the expectation that all packets 20 received by the test device contain a CRC value 22 that should match the expected CRC 26. However, in other embodiments, multiple expected CRC values can be stored in the test device 24, with one of the multiple expected CRC values selected to perform the comparison with the CRC value 22 in a received packet 20. In the following description, reference is made to examples where only a single expected CRC is stored in the test device 24.

The test environment 10 also includes a user system 30 (e.g., a personal computer or portable computer) that enables user control of the test packet generator 14. As further described below, one of the actions that can be performed in the user system 30 is the calculation of splice or signature values that can be incorporated into test packets 16 to force the CRC value 22 of the test packet 20 to be equal the expected CRC value 26, if the system under test 12 is functioning properly. Generation of these splice or signature values is performed by a splice calculation routine 32 that is executable on a control unit 34 in the user system 30. The control unit 34 is connected to a storage unit 36.

The generated splice values can be communicated to the test packet generator 14. The communication of the splice values can be accomplished over a network link or other shared interface 38, or alternatively, by storing the splice values onto magnetic or optical disks for loading into the test packet generator.

Figure 2:
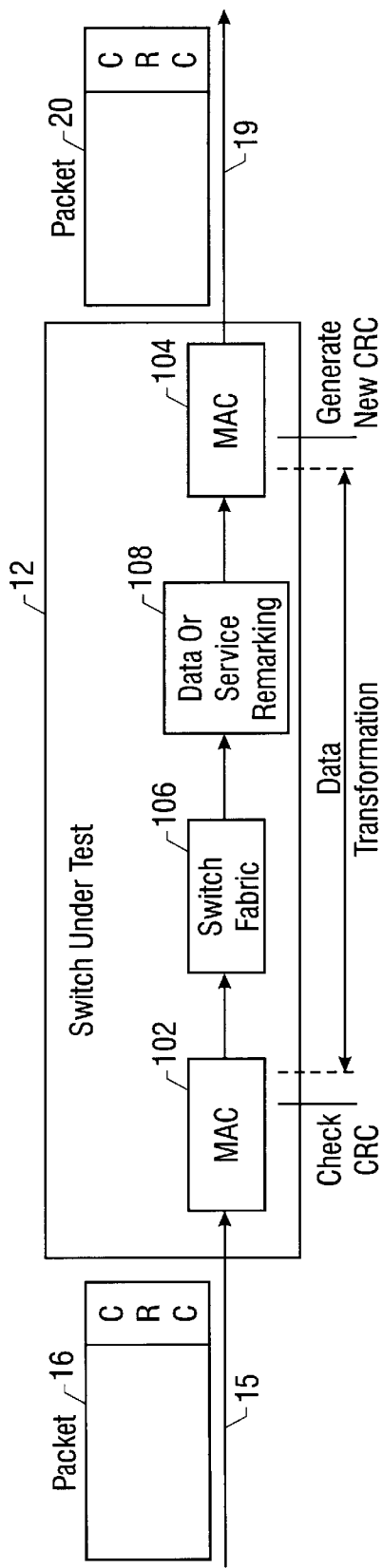
FIG. 2 is a block diagram of an example switch that is the system under test.

Referring to FIG. 2, an example system under test 12 is illustrated. The system under test 12 includes a first medium access control (MAC) module 102, which is connected to the link 15, and a second MAC module 104, which is connected to the link 19. In some embodiments, the MAC modules 102 and 104 are Ethernet MAC modules. The system under test 12 includes a switch fabric 106 that controls the routing of data based on addresses carried in the packet 16. The system under test 12 also includes a data or service remarking module 108 that performs a known transformation of at least a portion of the packet.

When the MAC module 102 receives the packet 16, it performs error detection based on the CRC field 18 in the packet 16. Packets that fail the CRC check are discarded. Packets that pass the CRC check are forwarded through a switch fabric 106 and remarking process. A data or service remarking module 108 performs a known transformation of the packet 16 as the transformed data is forwarded to the MAC module 104, which generates the outbound packet 20, with the new CRC field 22 based on the content of the new packet 20.

Figure 3:
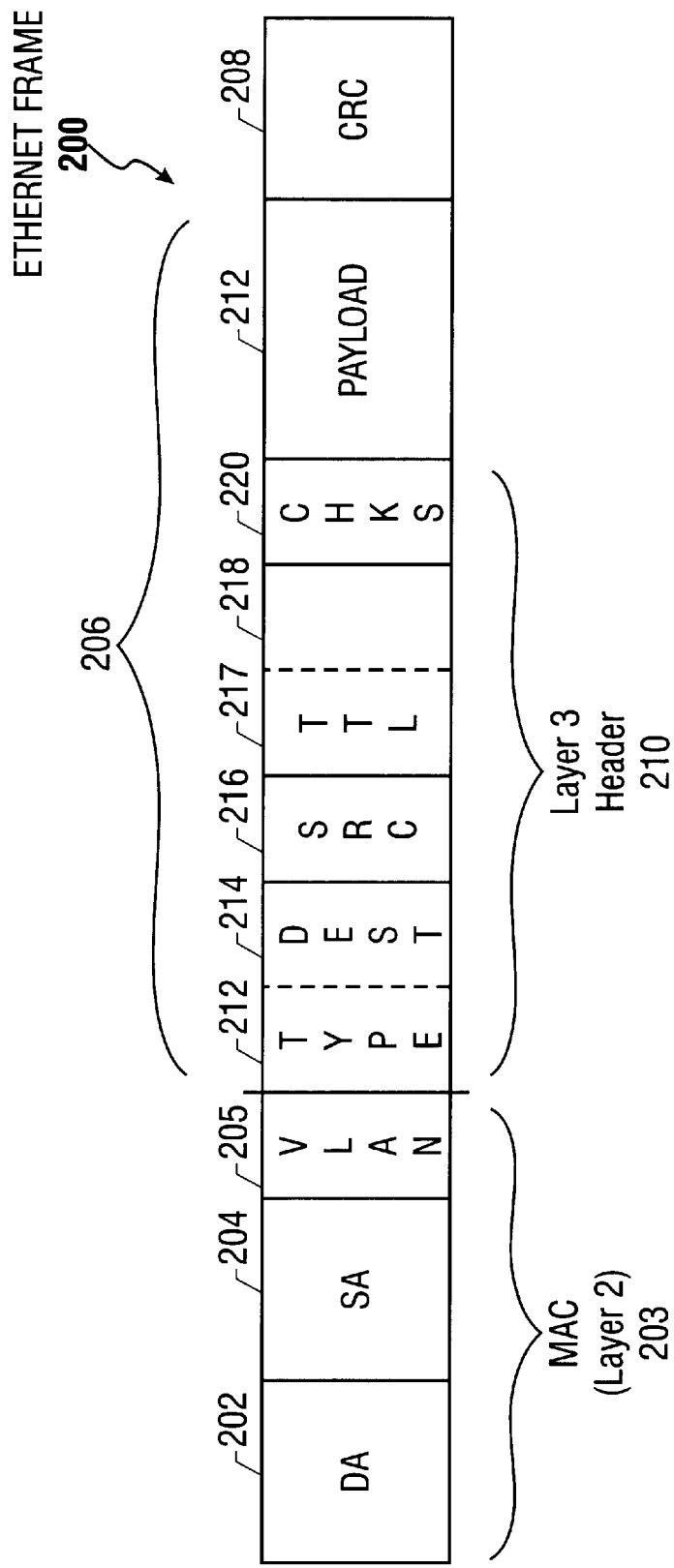
FIG. 3 illustrates an Ethernet frame.

Referring to FIG. 3, a typical Ethernet frame 200 is illustrated. The Ethernet frame 200 includes a MAC header 203, a payload 206, and a CRC field 208. The MAC header 203 carries layer 2 information including a destination address (DA) 202, a source address (SA) 204, and optionally a virtual LAN (VLAN) tag 205. The DA 202 and SA 204 are MAC addresses, which identify the destination and source terminals, respectively. The payload 206 carries layer 3 data, which in one embodiment, is an Internet Protocol (IP) datagram. One version of IP is described in RFC 791, entitled "Internet Protocol", and dated September 1981; while another version of IP is IPv6 as described in RFC 2460, entitled "Internet Protocol, Version 6 (IPv6) Specification", dated December 1998. In other examples, the payload 206 of the Ethernet frame 200 can carry another type of layer 3 datagram or other unit of data.

An IP datagram includes a protocol header 210 and a payload 212. In the example shown in FIG. 3, the protocol header 210 includes the following information: a type of service field 212 that provides an indication of the abstract parameters of a quality of service (QoS) desired; a time to live (TTL) indication 217 that indicates the maximum time the datagram is allowed to remain in the system; a destination network address field 214 containing the IP address of the destination network element; a source network address field 216 containing the IP address of the source network element; other header information 218 such as length and sequence identifiers; and a checksum 220 that is calculated based on the content of the protocol header 210.

The MAC header 203 and protocol header 210 are usually modified by a layer 3 switch, and in some cases, by certain types of layer 2 switches. The modification performed by the layer 3 switch includes changing the destination and source addresses 202 and 204, changing the TTL field 217, and recalculating a header checksum (220), as the datagram passes through the router. The inbound packet has a destination address field 202 containing the address of the inbound MAC 102 for the system under test 12 and a source address field 204 containing the address of the originating device (e.g., address of the test packet generator 14). The outbound packet has a destination address field 202 containing the address of the destination device (e.g., the test device 24) and a source address field 204 containing the address for the transmitting MAC (104) of the system under test 12. A parameter in the protocol header 210 that is modified by a layer 3 switch is the TTL indication 217, which is decremented. Also, because of changes to the TTL parameter 217, the checksum 220 is also recalculated.

A layer 2 or layer 3 switch containing a QoS process or policy filter can change the information in the type of service field 212 of the protocol header 210. The MAC header field 203 can also be modified in a switch that implements virtual LAN (VLAN) tagging. A virtual LAN is a software-defined LAN that groups users by logical addresses into a virtual LAN rather than a physical LAN. A LAN switch can support many virtual LANs. To communicate virtual LAN information between devices, VLAN tags are added to the MAC header 203.

Figure 4:
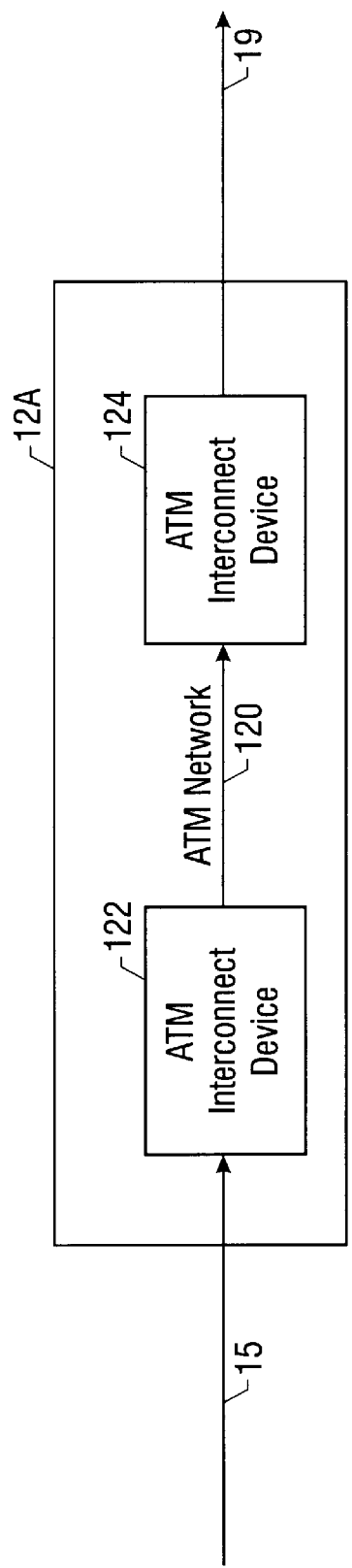
FIG. 4 illustrates another example switch that contains Asynchronous Transfer Mode (ATM) core devices.

Referring to FIG. 4, another type of switch 12A that may be capable of modifying contents of a packet includes ATM (asynchronous transfer mode) core devices, including a first ATM interconnect device 122 and a second ATM interconnect device 124 coupled over a network 120. The ATM standard is established by the International Telegraph and Telephone Consultative Committee Communications (CCITT) Standards Organization. On the ATM network 120, communications between the ATM interconnect devices 122 and 124 are performed using cells. In the switch 12A, an Ethernet frame received over the link 15 is divided into cells for communication over the ATM network 120. At the receiving end in the ATM interconnect device 124, the cells are reassembled back into the Ethernet frame. The reassembled Ethernet frame is then transmitted on the outbound link 19. As part of the forwarding process, the ATM network may change the contents of the MAC header 203 and protocol header 210 in a manner equivalent to that of a layer 2 or layer 3 switch. Also, as part of the Ethernet frame slicing and re-assembly performed in the switch 12A, bits of the Ethernet frame may be modified inadvertently. Since the CRC value is recalculated when the outbound frame is transmitted by the ATM interconnect device 124, the CRC value carried on link 19 can be correct even though the content of the frame was incorrectly modified or corrupted internally within system 12A.

The passage above describes some examples of switches that can modify content of a packet. However, the examples given above are not meant to be exhaustive, as other types of switches or systems can also modify header or payload content.

Figure 5:
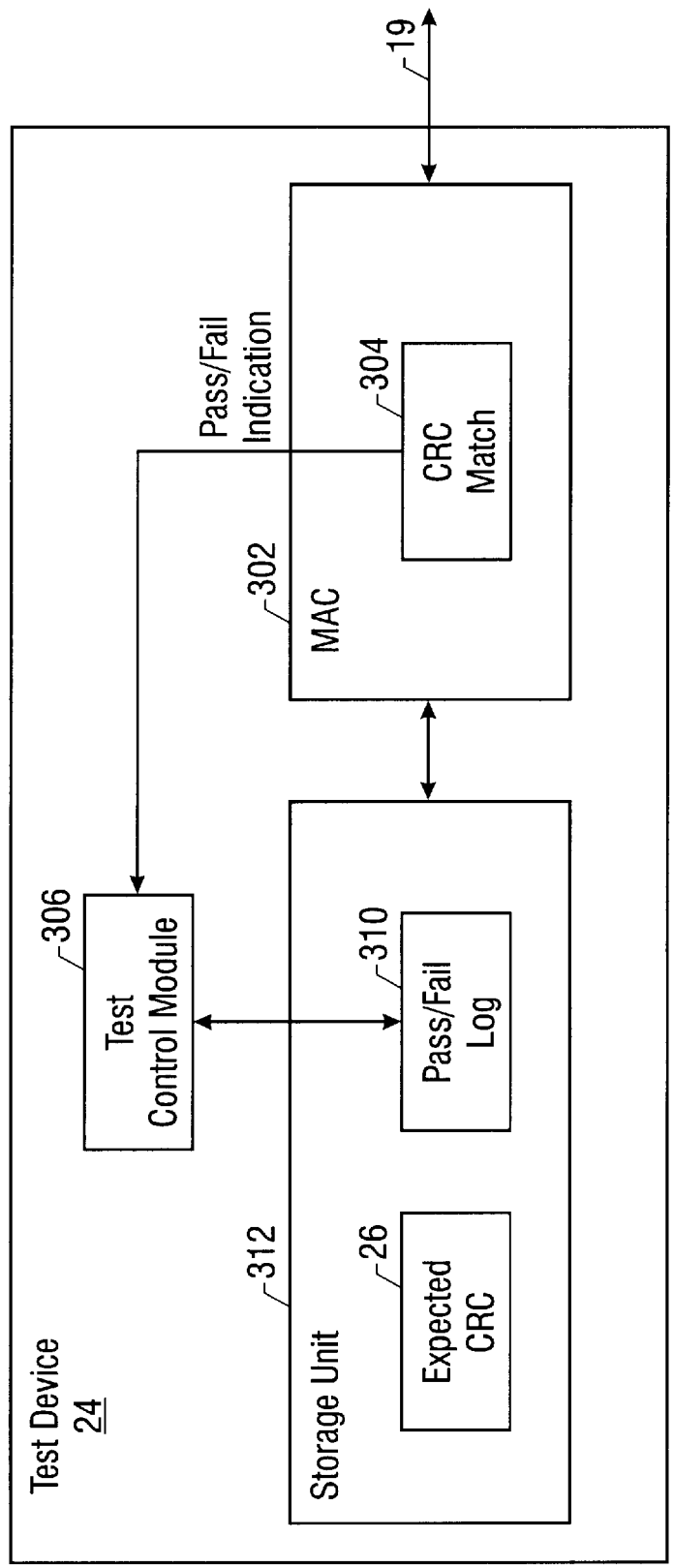
FIG. 5 is a block diagram of a test device that receives test packets from the system under test.

Referring to FIG. 5, components of the test device 24 (for receiving test packets and detecting for errors in the test packets) according to one example embodiment are illustrated. The arrangement shown in FIG. 5 is not intended to limit the scope of the invention, as other embodiments may utilize other arrangements of the test device 24. The test device 24 includes a MAC module 302, which in one embodiment is an Ethernet MAC module. The MAC module 32 communicates packets over the link 19, which in one embodiment is an Ethernet link.

The test device 24 receives packets 20 from the system under test 12 (which as described above are modified from the test packets 16 transmitted by the test packet generator 14). When the MAC module 302 receives the packet 20, it performs error detection based on the CRC value 22 contained in the received packet 20. If an error is detected based on the received CRC value 22, then the packet 20 is thrown away. However, if the received CRC is successful and shows no error for the transport of the frame across link 19, then a CRC match module 304 in the MAC 302 performs a comparison of the received CRC value with the expected CRC value 26 stored in a storage unit 312. The CRC match module 304 can produce a fail/pass indication, which is communicated to a test control module 306. In one embodiment, the test control module 306 can be a counter that counts the number of pass indications. In another embodiment, the pass/fail indication is written to a log 310 contained in the storage unit 312. In another embodiment, the contents of frames which do not match the expected CRC value 26 can be written into log 310 to enable further characterization of corruption mechanisms.

To further enhance reliability of the packet integrity check, the trigger value in the test device 24 can include the expected CRC value 26 plus one or more bytes (e.g., 2, 4) of the packet 20 (which has a known value). The comparison is then between the received CRC value 22 plus one or more header or payload bytes with their expected trigger value.

If the trigger value is 32 bits, which is the case if the trigger value includes only a 32-bit CRC value, then there is a one in $2^{32}$ chance that another packet may randomly produce the same CRC value (thereby producing a false success indication). By adding another two payload bytes to the trigger value, the likelihood that another packet will have the same CRC value is decreased to one in $2^{48}$, which improves test reliability.

The test device 24 in one embodiment can be a hardware component, such as application specific integrated circuit (ASIC), programmable gate array (PGA), a microcontroller, a microprocessor, and so forth. The test device 24 can be configured to perform predetermined tasks by loading software or firmware into the test device 24 for execution. Alternatively, the test device 24 is configured by hardware description code, such as VHDL (Very High-Speed Integrated Circuit Hardware Description Language) code, used to configure ASIC or PGA devices to perform pre-programmed tasks.

A mechanism has thus been described to enable a test device to check the integrity of a received test packet. The integrity check includes two checks: a first CRC check to determine if the received bits are consistent with the received CRC value; and a second check to determine if the received content is what is expected (validation of the entire content of the received packet including MAC addresses, protocol header, and payload) by comparing the received CRC with an expected CRC. By enabling a check of the content of the packet, the correctness of transformation of a packet performed by a system under test can be verified, which generally provides a more meaningful test to the user than simple CRC error detection.

Also, the test mechanism is relatively simple to implement, and it is also not compute-intensive. The entire content of the received packet can be checked without performing a bit-by-bit (or byte-by-byte) determination of whether each bit or byte in the received packet is correct, which can be extremely time intensive, especially if the packet contains hundreds or thousands of bytes of data. Rather, the check is performed by comparing a small part of the packet, such as the CRC value of the received packet, with an expected CRC Value. This simple check can usually be performed at "wire speeds," that is, the speed of transmission of the packets. As a result, in most cases, a queue in the receiving test device is not needed to accumulate packets as the packets are being compared. The ability to perform efficient integrity checks at high speeds becomes even more important when switches for high-speed network links are being tested, such as 10+ gigabit-per-second (Gbps) Ethernet links.

In other embodiments, instead of using CRC error detection, the packets may employ other error detection mechanism. Generally, such packets carry some form of check value that is based on the content of the entire packet. As used here, a "check value" refers to any signature carried in a packet to enable error detection of data carried in the packet.

Figure 6:
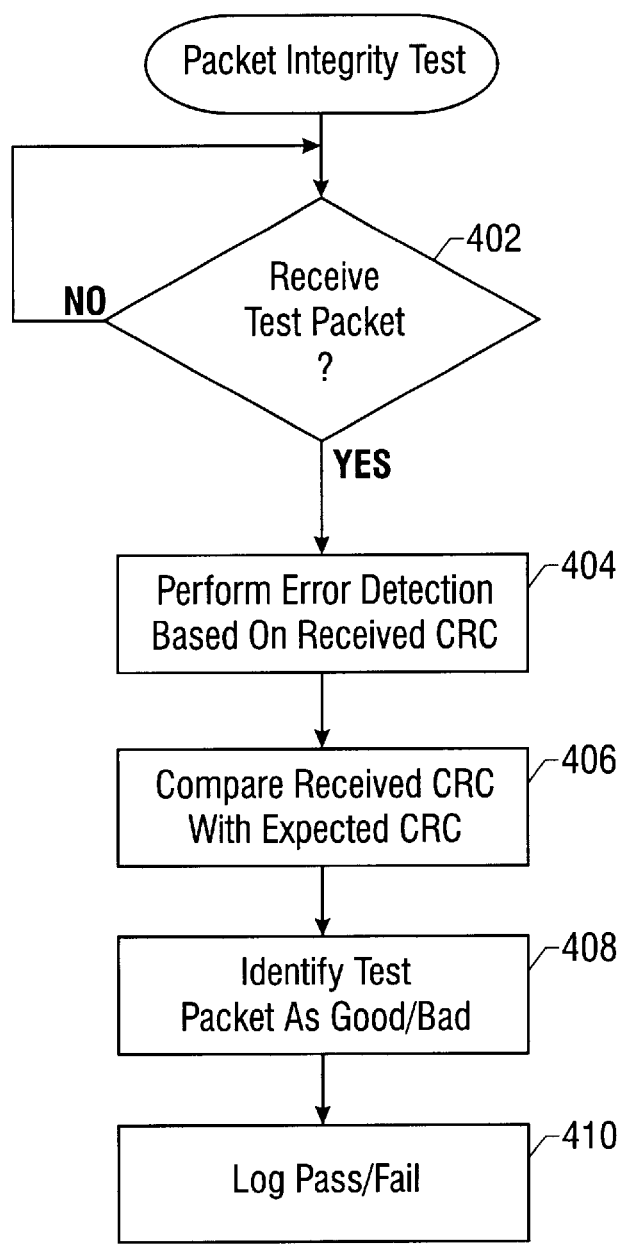
FIG. 6 is a flow diagram of a packet integrity test, in accordance with an embodiment.

Referring to FIG. 6, a packet integrity test process performed by the test device 24 in accordance with one embodiment is illustrated. The test device 24 first determines (at 402) if it has received a test packet. If so, the test device 24 performs error detection (at 404) based on the received CRC. Next, the test device 24 compares (at 406) the received CRC with an expected CRC. The test packet is identified (at 408) as being good or bad based on this comparison. The pass or fail state of the comparison can be logged (at 410) by either incrementing a counter in the test control module 306 of the test device 24 or by writing to a pass/fail log 310 in the storage unit 312 (FIG. 5).

As noted above, the receiving test device stores one expected CRC value, which simplifies the test process. Since the packet transformation performed by the system under test is known, using a know pattern as the payload in the test packets enables generation of a CRC value by the system under test that should be equal to the expected CRC if the system under test functions properly. However, in some tests, it may be desirable to vary the content of transmitted test packets (such as the protocol headers) between one of several values. Alternatively, the system under test can be configured to perform different transformations of the MAC and protocol headers in the test packet. For example, the QoS policy filter in a switch can be selected to function in one of plural configurations, which may cause the QoS policy filter to update the type-of-service field in the protocol header differently.

To enable the system under test to generate a CRC value that should equal the expected CRC value, a splice or signature value is added into the test packet by the test generator 14. The splice value forces the switch to generate a specific CRC value when it transmits the transformed packet to the test device 24. The splice value is dependent upon the expected CRC value, the packet content at the transmitting end, and the expected transformation performed by the system under test.

Figure 7:
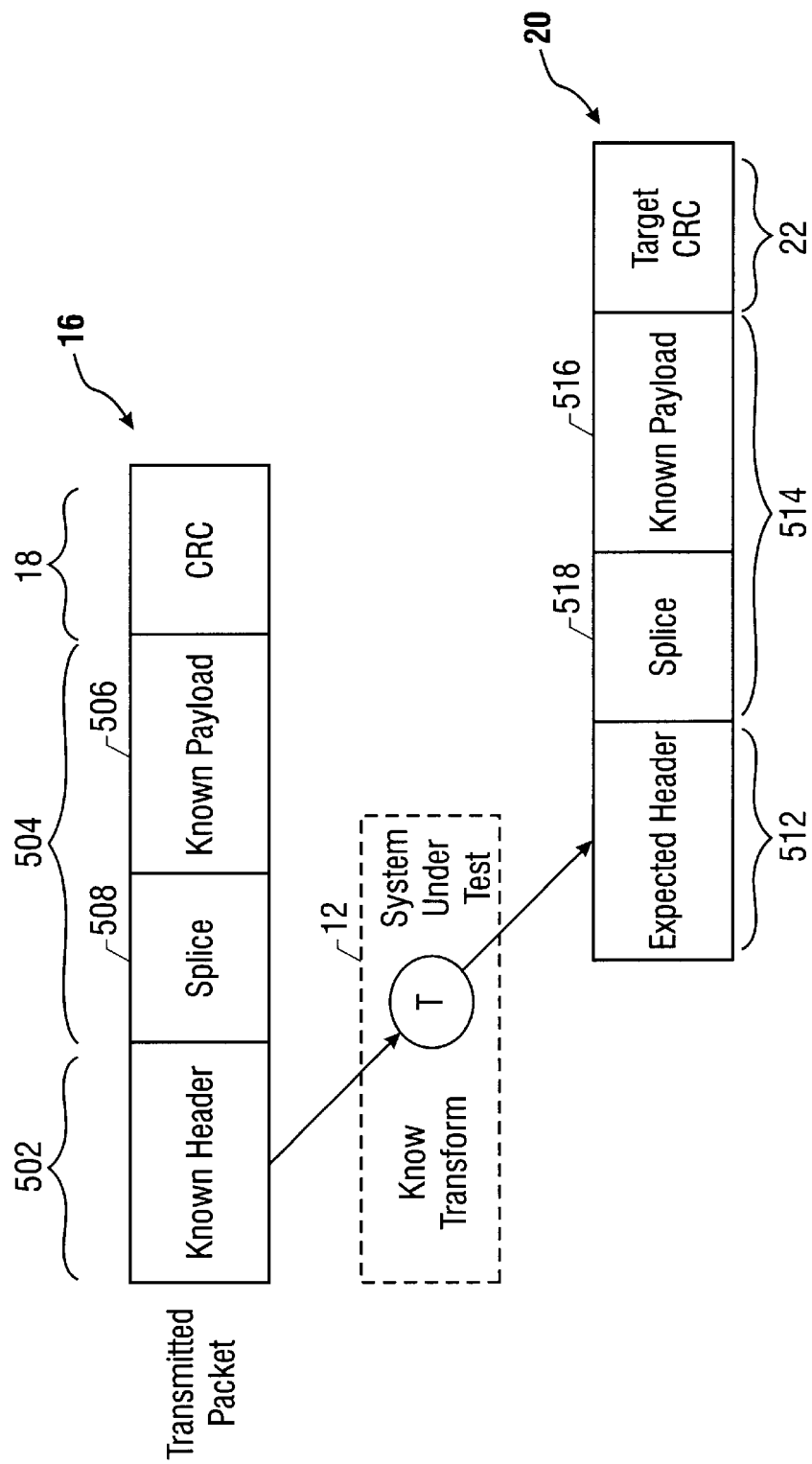
FIG. 7 illustrates the transformation of a header of a test packet to an expected header value by a system under test.

As shown in FIG. 7, the transmitted test packet 16 includes a known header portion 502, a payload portion 504, and the CRC field 18. The header portion 502 includes the MAC destination and source address fields 202 and 204 (FIG. 3) of the MAC layer as well as the protocol header 210 (FIG. 3). The payload portion 504 includes a known payload 506 (which contains a predetermined data pattern) and a splice value or signature 508 in accordance with some embodiments. The CRC field 18 in the transmitted test packet 16 is generated based on the known header portion 502 and the payload 504.

The system under test 12 applies a known transform of the known header portion 502, with some examples discussed above. The system under test 12 produces the packet 20, which contains an expected header portion 512 and a payload portion 514. The payload portion 514 contains the known payload 516 (which has not been modified from the known payload 506 of the transmitted test packet) and the splice value 518 (which remains unchanged from the splice value 508). The target CRC 22 generated by the system under test 12 is based on the expected header portion 512 and the payload portion 514. By controlling the splice value 508 in the transmitted packet 16, packets with different header portions 502 and payloads 506 can be forced to generate the desired target CRC value 22 after the known transformation performed by the system under test 12.

Figure 8:
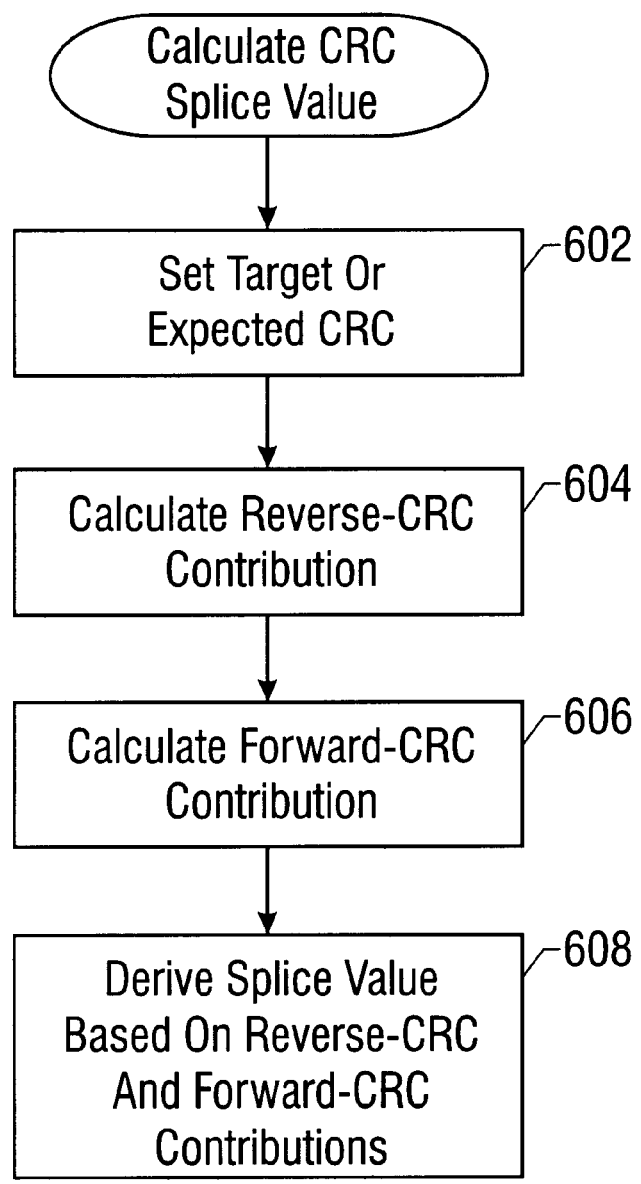
FIG. 8 is a flow diagram to calculate a cyclic redundancy check (CRC) splice or signature value in accordance with an embodiment.

Referring to FIG. 8, a process of calculating a CRC splice or signature value for inclusion in test packets is illustrated. The calculation of the splice value can be performed by the splice calculation routine 32 executable in the user system 30. In other embodiments, the calculation of the CRC splice value can be performed elsewhere, such as in the test packet generator 14 itself or in another system or device.

The target or expected CRC value is first set or received (at 602) by the splice calculation routine 32. Next, a reverse-CRC is calculated (at 604) based on the expected CRC value, a known payload 506, and an initial value of zero assumed in the splice location 508. The forward-CRC contribution is calculated (at 606) based on the expected header 512 (after transformation of the transmitted known header 502). The reverse-CRC and forward-CRC are combined, by performing a bit-wise exclusive-or operation, to derive (at 608) the necessary value that must be transmitted in the splice location 508.

Figure 9:
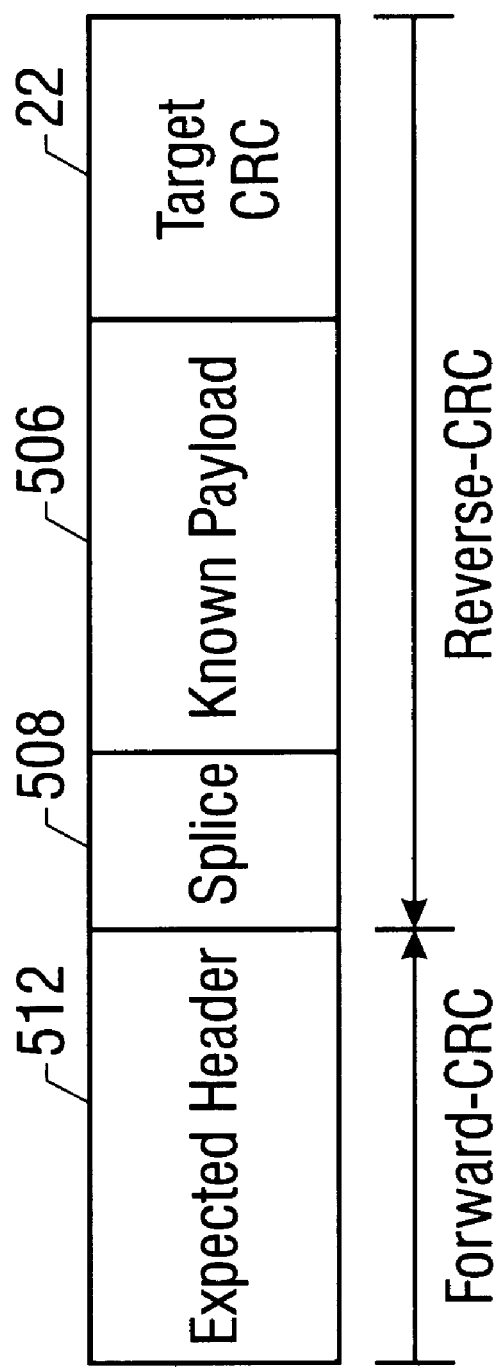
FIG. 9 illustrates calculation of a reverse-CRC value and a forward-CRC value to derive the CRC splice or signature value of FIG. 8.

The process of calculating the splice value is further illustrated in FIG. 9, where the forward-CRC is calculated based on the expected header 512 and the reverse-CRC is calculated based on the target CRC 22, the known payload 506, and an initial value of zero in the splice location 508.

Figure 10:
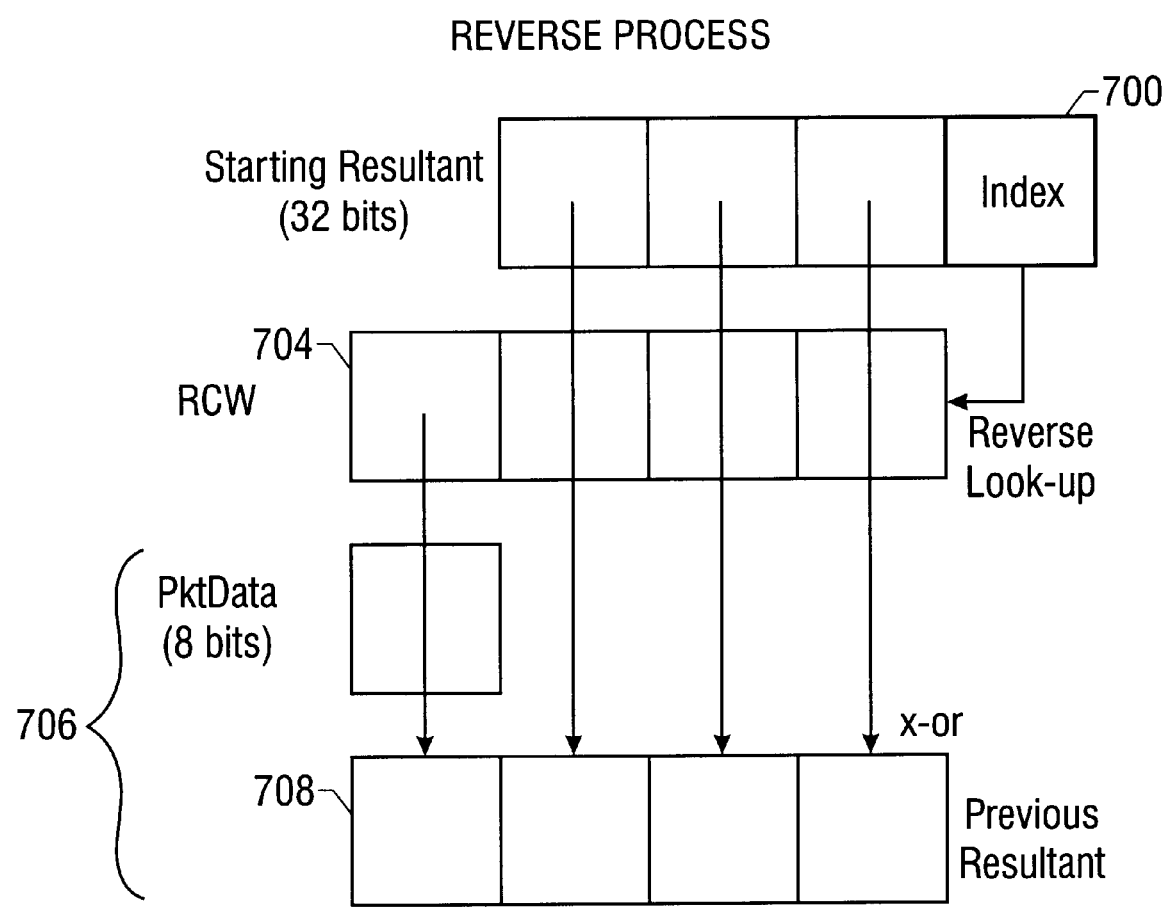
FIGS. 10 and 11 illustrate a reverse process to calculate the reverse-CRC value of FIG. 9 and a forward process to calculate the forward-CRC value of FIG. 9.
Figure 12:
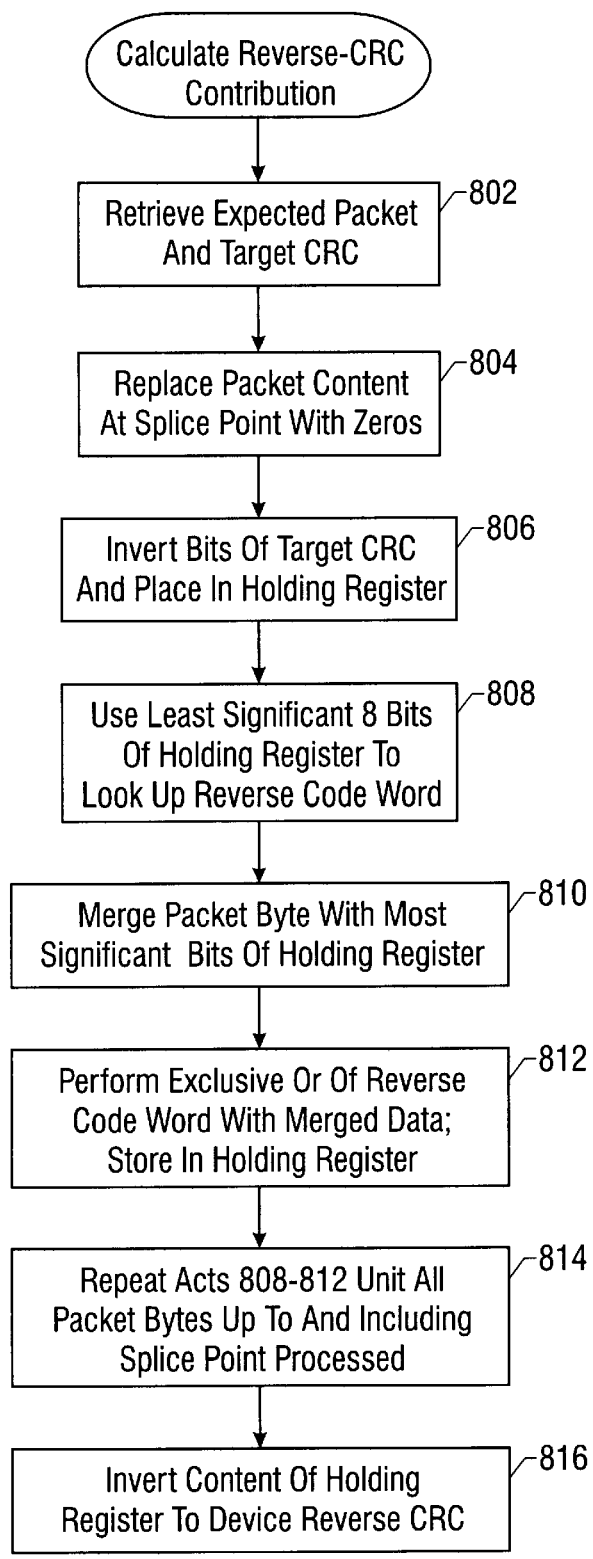
FIG. 12 is a flow diagram of a process to calculate a reverse-CRC value, in accordance with an embodiment.

Referring to FIGS. 10 and 12, the process of calculating the reverse-CRC is illustrated. The expected packet (containing the expected header portion 512 and the known payload 516) and target CRC 22 are first retrieved (at 802). The splice value 508 of the packet is replaced with all zeros (at 804). The bits of the target CRC are then inverted (at 806) and placed into a holding register, which in one example embodiment is a 32-bit holding register HR[31:0] if a 32-bit CRC is used. This forms the starting resultant 700 illustrated in FIG. 10.

Next, the least significant 8 bits of the holding register, HR[7:0], are used as an index to look up (at 808) a 32-bit reverse code word, RCW[31:0]:

ReverseLookup(HR[7:0])→RCW[31:0].

The reverse code word, RCW[31:0], is illustrated as 704 in FIG. 10. Next, starting with the last byte (or least significant byte) of the payload 516, PktData[7:0], the data byte PktData[7:0] is merged or concatenated (at 810) with the most significant 24 bits of the holding register, HR[31:8], with the result placed into MergeData[31:0]:

MergeData[31:0]=PktData[7:0]HR[31:8].

Next, a bit-wise exclusive-or of the reverse code word RCW[31:0] is performed (at 812) with the merged data, MergeData[31:0], with the resultant placed back into the holding register HR[31:0]:

MergeData[31:0]XOR RCW[31:0]→HR[31:0].

This operation is illustrated as 706 in FIG. 10, with the resultant represented at 708, which is stored in the holding register HR[31:0]. The resultant 708 is referred to as the "previous resultant."

Next, the acts performed at 808 through 812 are repeated (at 814) for successive bytes of the packet data. As noted above, the process starts with the last byte of the packet data at 808. All remaining bytes of payload 516 (from back to front), as well as the four splice bytes (set to zero), are factored into acts 808 through 812 one byte at a time. For each subsequent operation, the previous resultant 708 is used as the starting resultant 700. After all the bytes have been processed, bits of the resultant 708 in the holding register HR[31:0] are inverted to derive the reverse-CRC, RCRC[31:0].

Figure 11:
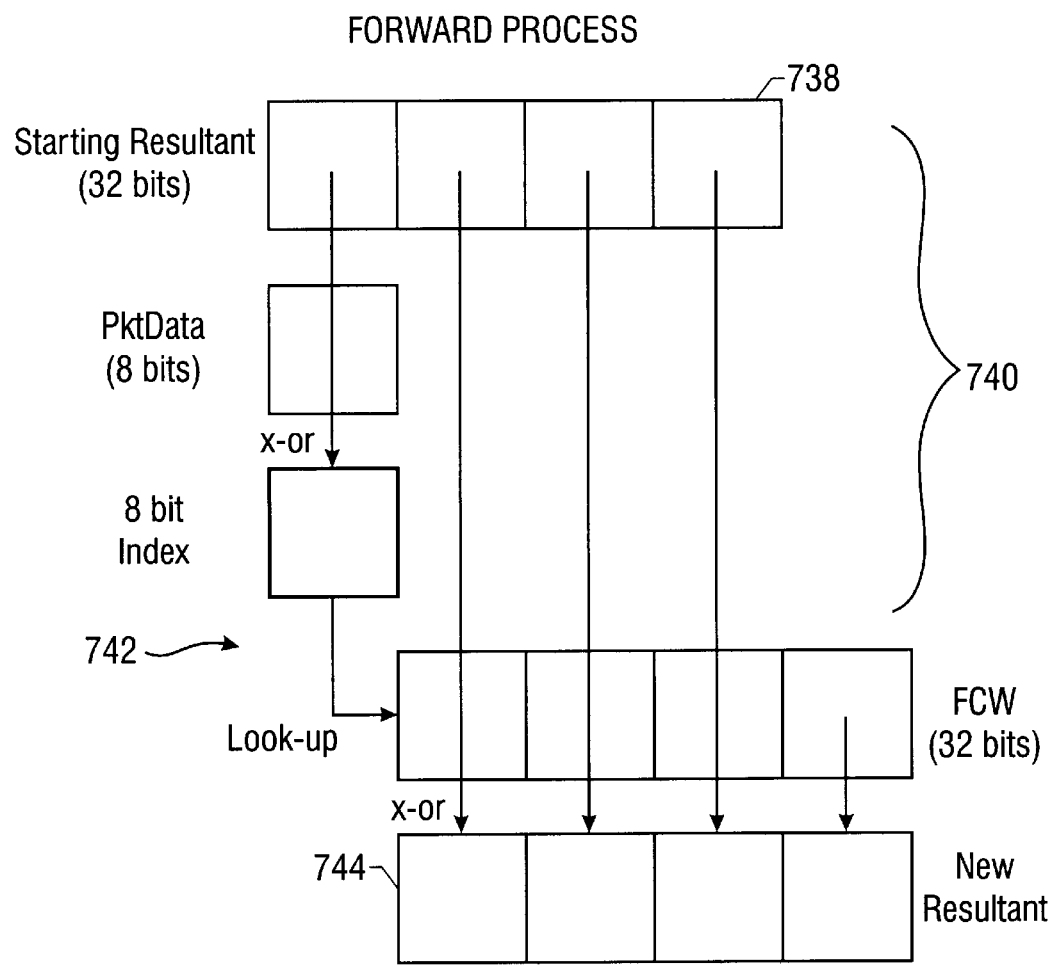
Figure 13:
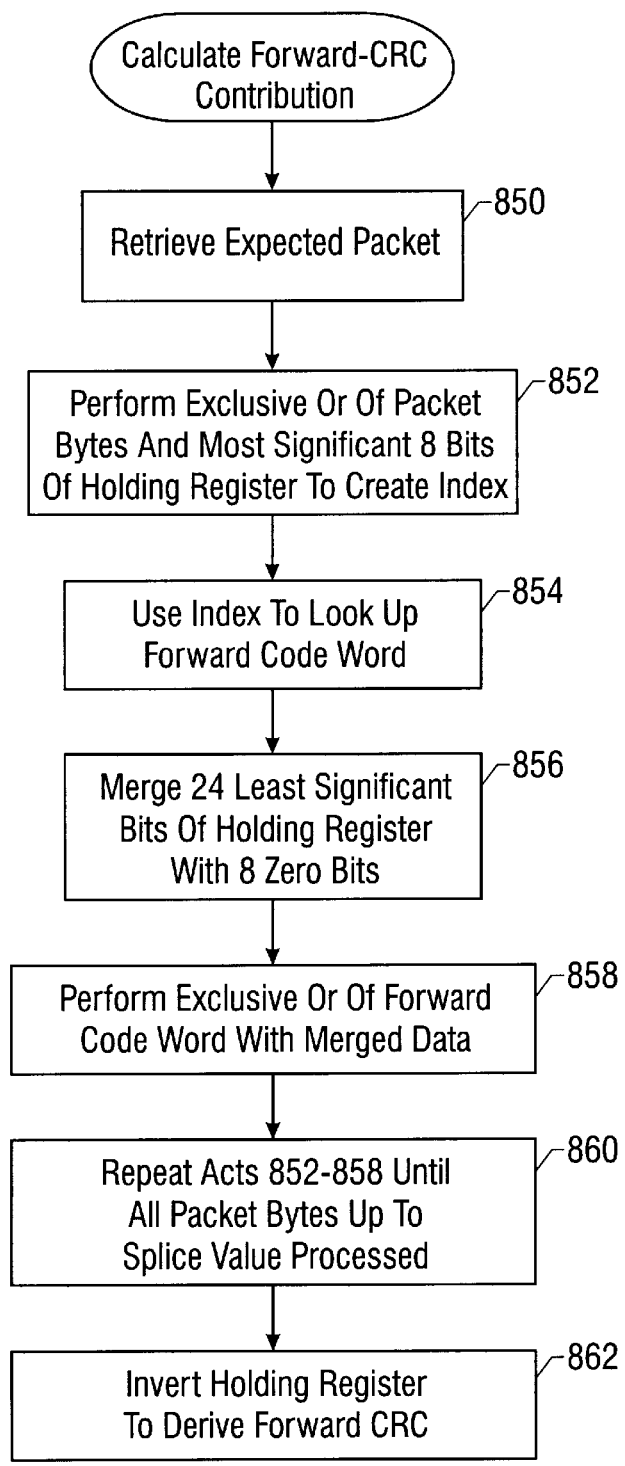
FIG. 13 is a flow diagram of a process to calculate a forward-CRC value, in accordance with an embodiment.

Referring to FIGS. 11 and 13, the process of calculating the forward-CRC is illustrated. As shown in FIG. 9, the forward-CRC contribution is based on the expected header 512. Initially, the expected header 512 is retrieved (at 850). Also, the holding register, HR[31:0] is initialized to all ones:

HR[31:0]=[11111111 11111111 11111111 11111111].

This constitutes a starting resultant 738 (FIG. 11). Next, the routine performs (at 852) an exclusive-or of a packet byte and the most significant 8 bits of the holding register, HR[31:24], to produce an index, DataIndex[7:0]:

PktData[7:0]XOR HR[31:24]→DataIndex[7:0].

The forward-CRC calculation process starts with the first byte of the packet data (which corresponds to the first byte of the expected header 512). The exclusive-or operation of the most significant 8 bits of the starting resultant and the byte of packet data to produce the index DataIndex[7:0] is illustrated as 740 in FIG. 11.

The index, DataIndex[7:0], is then used (at 854) to look up the forward code word, FCW[31:0], a process shown as 742 in FIG. 11:

ForwardLookup(DataIndex[7:0])→FCW[31:0].

Next, the 24 least significant bits of the holding register HR[31:0] are merged or concatenated (at 856) with eight zero bits, with the result placed into MergeData[31:0]:

MergeData[31:0]=HR[23:0][00000000].

A bit-wise exclusive-or of the forward code word, FCW [31:0], is performed (at 858) with the merged data, MergeData[31:0], with the resultant placed into the holding register HR[31:0]:

FCW[31:0]XOR MergeData[31:0]→HR[31:0].

The resultant in the holding register HR[31:0] at this stage is shown as 744 in FIG. 11, which is referred to as a "new resultant."

Next, acts 852–858 are repeated (at 860) until all packet bytes in the header 512 have been processed. In each subsequent operation, the new resultant 744 is used as the starting resultant 738, in FIG. 11. After the last byte of the expected header 512 has been processed, the bits of the new resultant 744 are inverted to derive the forward-CRC, FCRC [31:0].

As described above, the reverse-CRC, RCRC[31:0], is based on the target CRC value 22, the known payload 514, and four bytes of splice (set to zero), while the forward-CRC, FCRC[31:0], is based on the expected header 512. When combined by performing an exclusive-or, the reverse and forward CRC values produce the splice value 508 to be transmitted (in 16). When a CRC is calculated based on the expected header 512, splice 518, and known payload 516, the target CRC value 22 is produced. Thus, if the expected header 512 varies (either due to variation of the known header 502 or variation of the known transform in the system under test), a different splice value 508 can be placed into the test packet 16. In one arrangement, several different splice values can be generated in the user system 30 (FIG. 1) and loaded into a storage unit 15 in the test packet generator 14. Depending on which of several types of tests is to be run (with the test types having different expected header values), one of the splice values stored in the storage unit 15 is selected by the test packet generator to add into the test packet.

In the test procedures described above, the test packets generated by the test generator contain a known header as well as a known payload. However, to make tests more comprehensive, it may be desirable to make the data carried in the payload portion of the test packet "random." As used here, a "random" payload does not necessarily indicate that the payload is "unknown" or strictly random in the mathematical sense. A random payload can refer to selection of one of plural values, with the test generator not knowing ahead of time which payload will be selected for a given header.

Figure 14:
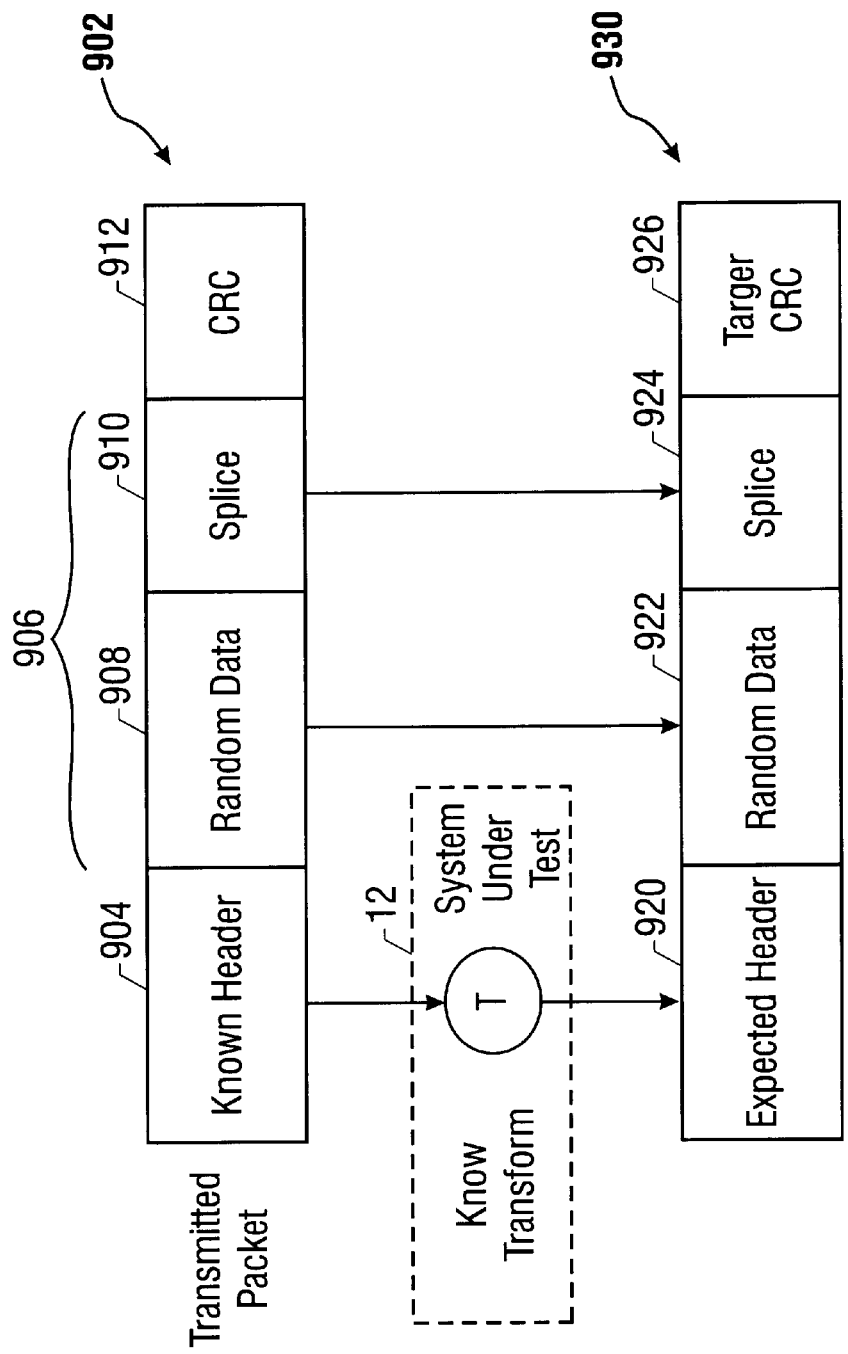
FIG. 14 illustrates a mechanism to enable verification of test packets containing random data.

Testing with packets containing random payload data is illustrated in FIG. 14. A test packet 902 transmitted from the test packet generator 14 has a known header 904, a payload portion 906 containing random data 908 and a splice 910, and a CRC value 912 that is based on the known header 904 and the payload portion 906. When the test packet 902 is forwarded to the system under test 12, a known transform is applied to the header 904 to produce an expected header 920. The random data 922 in the packet 930 forwarded to the system under test 12 remains the same as the random data 908, and the splice 924 has the same value as the splice 910. A target CRC 926 is based on the expected header 920, random data 922, and splice 924.

In accordance with some embodiments of the invention, the splice value 910 in the test packet 902 has a value to force the CRC 926 in the packet 930 to a target value. The splice value 910 is calculated in "real-time"; that is, the splice value 910 is generated as the random data 908 is generated since the test packet generator does not know ahead of time the content of the payload. The generated splice value 910 is then added to the test packet before it is sent to a MAC module for calculation of the CRC 912.

Figure 15:
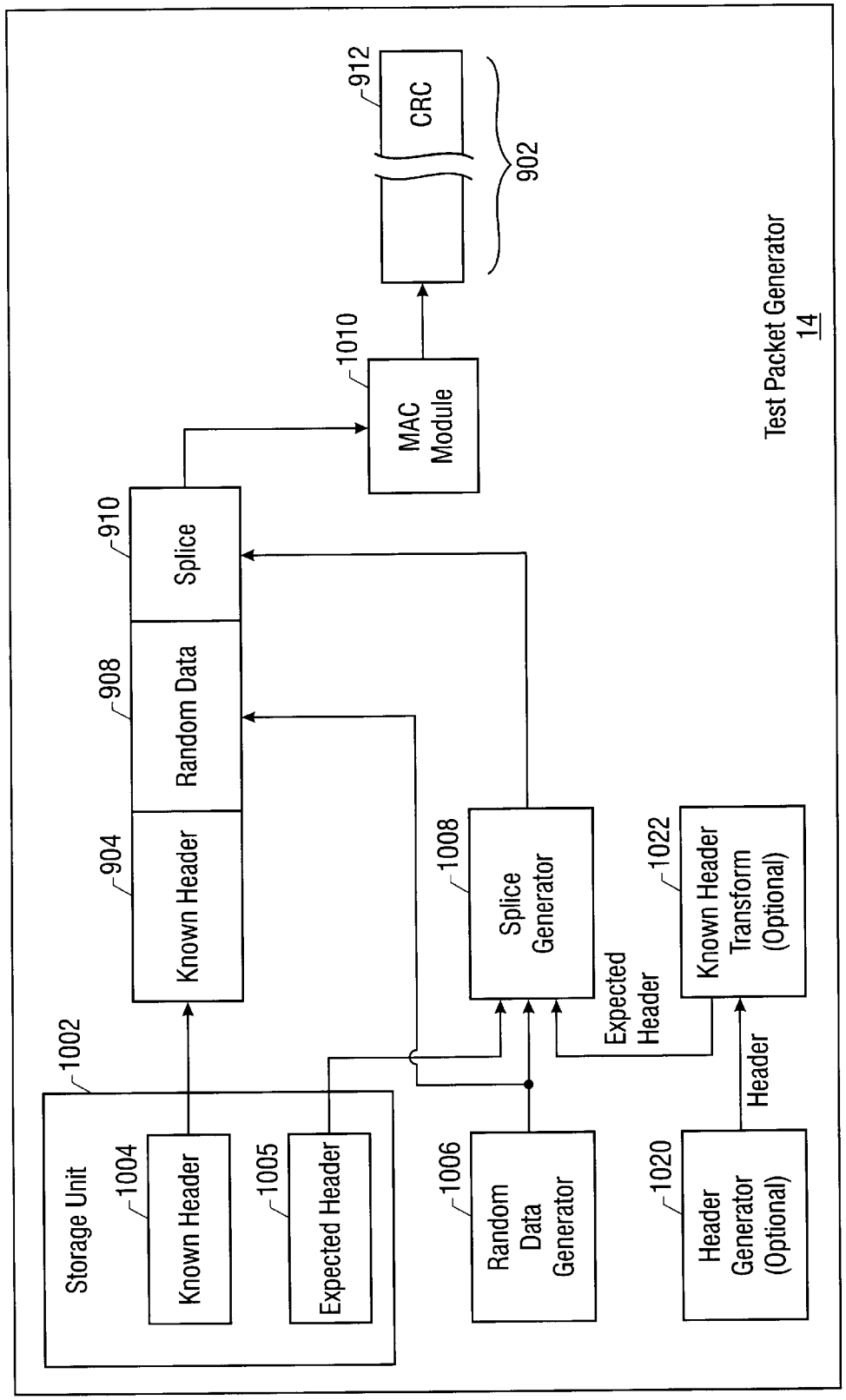
FIG. 15 is a block diagram of a test packet generator, in accordance with an embodiment, that generates test packets containing random data and a splice or signature value that is set to a value to achieve a target CRC.

Referring to FIG. 15, one arrangement of the test packet generator 14 to enable testing with random data is illustrated. A known header value 1004 and an expected header value 1005 are stored in a storage unit 1002. The known header value 1004 is used as the header 904 of the test packet 902.

Figure 16:
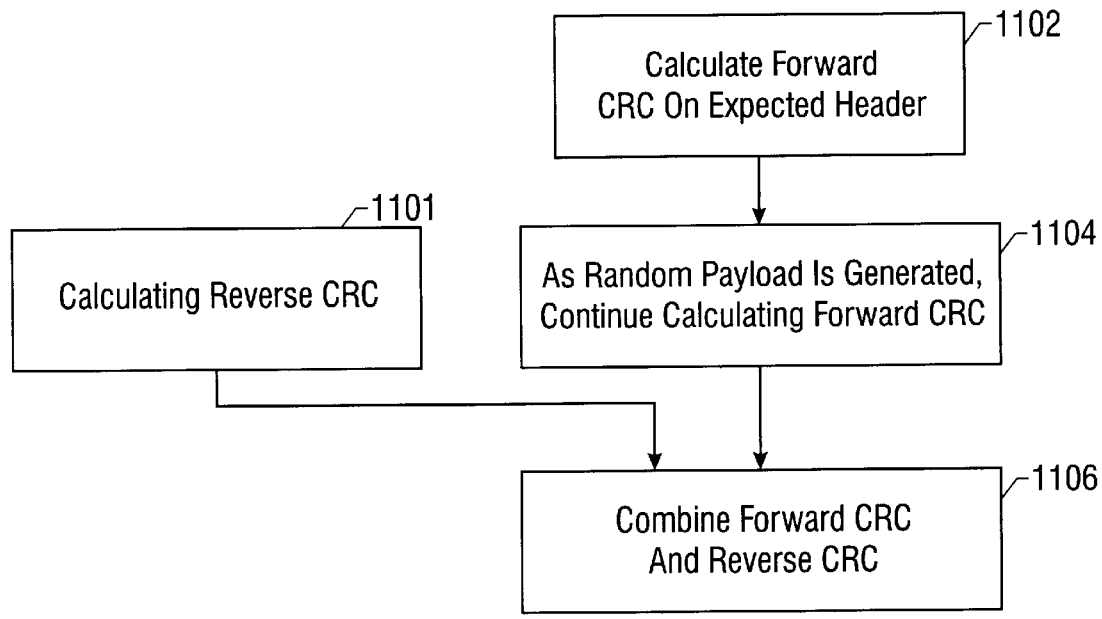
FIG. 16 is a flow diagram of a process of calculating a splice value to add to the test packet containing random data.

The test packet generator 14 also includes a random data generator 1006 to provide the random data 908 in the test packet 902. Again, as noted above, the random data generator 1006 does not necessarily generate random data in the mathematical sense (although in some embodiments it might). A splice generator 1008 generates the splice value 910 based on the random data generated by the random data generator 1006, the expected header value 1005, and the reverse-CRC contribution due to the target CRC 926. The CRC 912 is generated by a MAC module 1010. Referring to FIG. 16, the process of calculating the splice is illustrated. The splice process still relies upon both the forward and reverse CRC contributions. The process is identical to the process described above in FIG. 8, with the exception that the random data 908 is removed from the reverse-CRC at 604 and instead is factored into the forward-CRC process at 606.

In the case where random data from the payload 908 is factored into the forward-CRC, the process described above in connection with FIGS. 10 and 12 can be used to calculate the reverse-CRC. The expected packet at 802 need only include the target CRC 926 and the splice 910. Following the process of FIG. 12, the inverted bits of target CRC 926 are placed in the holding register at 806, and the bytes of splice data (initially set to zero) are then used in acts 808, 810, 812, and 814 a total of four times to determine the reverse-CRC contribution which is the inverted content of the holding register at 816. Since the reverse-CRC contribution does not include any random data 908, the reverse-CRC contribution to the splice may be pre-calculated (at 1101), as shown in FIG. 16.

Calculation of the forward-CRC starts (at 1102) by factoring in the expected header 1005. After the expected header 1005 is processed one byte at a time, the process described above in connection with FIGS. 11 and 13 continues by factoring in the random payload. As the random payload is generated, the calculation of the forward-CRC contribution repeats acts 852 through 858 (at 1104). Thus, as each new byte of the random payload is generated, the forward-CRC calculation of FIGS. 11 and 13 is repeated. Each byte of random payload is also provided in PktData [7:0]. After all the bytes of the random payload have been processed, the forward-CRC is derived by inverting the bits of the holding register as shown in FIG. 13 at 862. The splice generator 1008 then combines the forward and reverse CRC contributions by performing a bit-wise exclusive-or operation of the forward and reverse CRC contributions to calculate the splice value 910.

Thus, an efficient test mechanism is provided to test switches using random data. Tests according to some embodiments enable the verification of the entire test packet, including the header portion and the random payload. The verification is performed based on a limited number of bytes, which in some embodiments includes the CRC or other check value. By analyzing only a limited number of bytes to validate an entire test packet, tests can be performed at relatively high speeds.

In this description, reference is made to various software routines or modules. Also, reference is also made to hardware description language code, such as VHDL code, that can be used to configure programmable hardware devices (e.g., ASICs, PGAs, and the like). Instructions of software routines or modules may be stored on one or more storage units (e.g., semiconductor memory devices, magnetic media, optical media, etc.) in the corresponding systems or devices and loaded for execution on corresponding control units (e.g., microprocessors, microcontrollers, and the like). Hardware description language code is "programmed" into a hardware device by one of various mechanisms, such as by blowing fuses or other configurations of circuitry in the hardware device. Instructions of the hardware description code can also be said to be loaded into hardware devices such as ASICs and PGAs for "execution"—the instructions of the hardware description language code cause the programmable hardware devices in a selected manner.

The instructions of the software routines or modules may be loaded or transported into the node or element in one of many different ways. For example, code segments including instructions stored on floppy discs, CD or DVD media, a hard disk, or transported through a network interface card, modem, or other interface device may be loaded into the system and executed as corresponding software routines or modules. In the loading or transport process, data signals that are embodied as carrier waves (transmitted over telephone lines, network lines, wireless links, cables, and the like) may communicate the code segments, including instructions, to the network node or element. Such carrier waves may be in the form of electrical, optical, acoustical, electromagnetic, or other types of signals. Similarly, instructions of hardware description language code can also be "loaded" into hardware devices for "execution"—that is, when a hardware device is configured according to the hardware description language code, it performs tasks according to what is set forth in the hardware description language code.

As discussed above, forward and reverse code words (FCW and RCW) are used in the calculation of a splice or signature value to force a desired target CRC value in a packet generated by a system under test. The forward code words accessed at 854 in FIG. 13 can be described mathematically or be derived from public domain sources. The forward code words represent a well known process associated with calculation of CRC-32 values based upon international standards for transmission of packets on Ethernet and other networks.

In one embodiment, the forward code words (FCW) are expressed as a function of an 8-bit index (X). Each 8-bit index generates a 32-bit code word. The 32-bit code word are represented here as four separate 8-bit code bytes (A, B, C, and D). Since X is an 8-bit value, there are 256 possible values for X. These values in decimal notation are 0 to 255, or in binary notation [00000000] through [11111111].

For each value X, a unique forward code word (FCW) can be derived.

$$FCW=f(X)=A\ B\ C\ D,$$

or in binary notation, $$FCW[31:0]=f(x[7:0])=a[7:0]b[7:0]c[7:0]d[7:0].$$

The following provides a set of equations for the forward lookup which relates index value (X) to each of the four forward code bytes (A, B, C, and D). The following is provided only as an example of how the forward code word can be derived in accordance with one example embodiment. In other embodiments, other techniques are also possible. In these equations, the ^ symbol is used to represent an exclusive-or operation between a set of bits.

$$X=x[7:0]=[x7\ x6\ x5\ x4\ x3\ x2\ x1\ x0],$$

$$A=a[7:0]=[a7\ a6\ a5\ a4\ a3\ a2\ a1\ a0],$$

$$B=b[7:0]=[b7\ b6\ b5\ b4\ b3\ b2\ b1\ n0],$$

$$C=c[7:0]=[c7\ c6\ c5\ c4\ c3\ c2\ c1\ c0],$$

$$D=d[7:0]=[d7\ d6\ d5\ d4\ d3\ d2\ d1\ d0],$$

where, $a7=x6\hat{}x5\hat{}x0,$ $a6=x5\hat{}x4,$ $a5=x7\hat{}x4\hat{}x3\hat{}x1,$ $a4=x6\hat{}x3\hat{}x2\hat{}x0,$ $a3=x5\hat{}x2\hat{}x1,$ $a2=x4\hat{}x1\hat{}x0,$ $a1=x3\hat{}x0,$ $a0=x2,$ $b7=x7\hat{}x3\hat{}x2,$ $b6=x6\hat{}x2\hat{}x1,$ $b5=x5\hat{}x1\hat{}x0,$ $b4=x4\hat{}x0,$ $b3=x3,$ $b2=x2,$ $b1=x7,$ $b0=x7\hat{}x6\hat{}x1,$ $c7=x7\hat{}x6\hat{}x4\hat{}x3,$ $c6=x6\hat{}x5\hat{}x3\hat{}x2,$ $c5=x7\hat{}x5\hat{}x4\hat{}x2,$ $c4=x7\hat{}x6\hat{}x4\hat{}x3,$ $c3=x7\hat{}x6\hat{}x5\hat{}x3\hat{}x2\hat{}x1,$ $c2=x6\hat{}x5\hat{}x4\hat{}x2\hat{}x1\hat{}x0,$ $c1=x5\hat{}x4\hat{}x3\hat{}x1\hat{}x0$ $c0=x4\hat{}x3\hat{}x2\hat{}x0,$ $d7=x7\hat{}x1,$ $d6=x7\hat{}x6\hat{}x1\hat{}x0,$ $d5=x7\hat{}x6\hat{}x5\hat{}x1\hat{}x0,$ $d4=x6\hat{}x5\hat{}x4\hat{}x0,$ $d3=x7\hat{}x5\hat{}x4\hat{}x3\hat{}x1,$ $d2=x7\hat{}x6\hat{}x4\hat{}x3\hat{}x2\hat{}x1\hat{}x0,$ $d1=x6\hat{}x5\hat{}x3\hat{}x2\hat{}x1\hat{}x0,$ and $d0=x7\hat{}x5\hat{}x4\hat{}x2\hat{}x0.$ The forward and reverse code words are related to one another. The list of reverse code words (RCW) are created by sorting the original list of forward code words by their least significant code byte (D) and including the original forward index value (X):

$$RCW=\text{ReverseLookUp}(D)=X\ A\ B\ C,$$

or using a binary notation:

$$RCW[31:0]=\text{ReverseLookUp}(d[7:0])=x[7:0]a[7:0]b[7:0]c[7:0],$$

The following provides a set of equations for the reverse lookup which relates index value (D) to each of the four reverse code bytes (X, A, B, and C):

$$D=d[7:0]=[d7\ d6\ d5\ d4\ d3\ d2\ d1\ d0],$$

$$X=x[7:0]=[x7\ x6\ x5\ x4\ x3\ x2\ x1\ x0],$$

$$A=a[7:0]=[a7\ a6\ a5\ a4\ a3\ a2\ a1\ a0],$$

$$B=b[7:0]=[b7\ b6\ b5\ b4\ b3\ b2\ b1\ n0],$$

$$C=c[7:0]=[c7\ c6\ c5\ c4\ c3\ c2\ c1\ c0],$$

where, $x7=d7\hat{}d6\hat{}d4\hat{}d2\hat{}d1,$ $x6=d6\hat{}d5\hat{}d3\hat{}d1\hat{}d0,$ $x5=d6\hat{}d5,$ $x4=d7\hat{}d5\hat{}d4,$ $x3=d6\hat{}d4\hat{}d3,$ $x2=d7\hat{}d5\hat{}d3\hat{}d2,$ $x1=d6\hat{}d4\hat{}d2\hat{}d1,$ $x0=d7\hat{}d5\hat{}d3\hat{}d1\hat{}d0,$ $a7=d7\hat{}d5,$ $a6 = d7\char`\^d6\char`\^d4,$ $a5 = d6\char`\^d5\char`\^d3,$ $a4 = d5\char`\^d4\char`\^d2,$ $a3 = d7\char`\^d4\char`\^d3\char`\^d1,$ $a2 = d6\char`\^d3\char`\^d2\char`\^d0,$ $a1 = d7\char`\^d6\char`\^d5\char`\^d4\char`\^d1\char`\^d0,$ $a0 = d7\char`\^d5\char`\^d3\char`\^d2,$ $b7 = d5\char`\^d1,$ $b6 = d7\char`\^d4\char`\^d0,$ $b5 = d7\char`\^d4\char`\^d3\char`\^d2\char`\^d0,$ $b4 = d4\char`\^d3\char`\^d1\char`\^d0,$ $b3 = d6\char`\^d4\char`\^d3,$ $b2 = d7\char`\^d5\char`\^d3\char`\^d2,$ $b1 = d7\char`\^d6\char`\^d4\char`\^d2\char`\^d1,$ $b0 = d7\char`\^d6\char`\^d5\char`\^d3\char`\^d1\char`\^d0,$ $c7 = d6\char`\^d4\char`\^d2\char`\^d0,$ $c6 = d7\char`\^d6\char`\^d5\char`\^d4\char`\^d3\char`\^d2\char`\^d1\char`\^d0,$ $c5 = d7\char`\^d5\char`\^d3\char`\^d1,$ $c4 = d6\char`\^d4\char`\^d2\char`\^d0,$ $c3 = d6\char`\^d5\char`\^d4\char`\^d3\char`\^d2\char`\^d1\char`\^d0,$ $c2 = d7\char`\^d6\char`\^d5\char`\^d3\char`\^d1,$ $c1 = d6\char`\^d5\char`\^d4\char`\^d2\char`\^d0,$ $c0 = d7\char`\^d6\char`\^d5\char`\^d3\char`\^d2\char`\^d1\char`\^d0.$ While the invention has been disclosed with respect to a limited number of embodiments, those skilled in the art will appreciate numerous modifications and variations therefrom. It is intended that the appended claims cover such modifications and variations as fall within the true spirit and scope of the invention. For example, reference is made to Ethernet packets in some of the described embodiments—in further embodiments, other types of packets or frames for communicating over wireline or wireless links or networks can also be employed.

What is claimed is:

1. A method of testing packets communicated over a network, comprising:

receiving a packet having a check value based on content of the entire packet;

storing a pre-loaded expected check value, the pre-loaded expected check value stored prior to receiving the packet;

performing error detection using the check value of the received packet; and comparing the check value of the received packet with the pre-loaded expected check value.

2. The method of claim 1, wherein receiving the packet is performed by a test device, and wherein storing the expected check value comprises storing the expected check value in the test device.

3. The method of claim 1, wherein receiving the packet having the check value comprises receiving the packet having a cyclic redundancy check value.

4. The method of claim 1, further comprising:

receiving plural packets each having a check value; and comparing the check value of each packet with the expected check value.

5. The method of claim 4, further comprising counting a number of packets containing check values that match the expected check value.

6. The method of claim 1, wherein receiving the packet is performed by a receiving device, the method further comprising:

a first device transmitting a test packet; and a network device transforming the test packet to produce the packet received by the receiving device.

7. The method of claim 6, wherein the packet contains a header portion, and wherein the network device transforming the test packet comprises the network device transforming the header portion.

8. The method of claim 7, wherein the network device transforming the header portion comprises modifying media access control header information.

9. The method of claim 8, wherein the network device transforming the media access control header comprises modifying at least one of a source and destination address.

10. The method of claim 7, wherein the network device transforming the header portion comprises modifying content of a protocol header.

11. The method of claim 10, wherein the network device transforming the protocol header comprises modifying an Internet Protocol header.

12. The method of claim 10, wherein the network device transforming the protocol header comprises modifying a layer 3 protocol header.

13. The method of claim 10, wherein the network device transforming the protocol header comprises modifying a time to live parameter.

14. The method of claim 10, wherein the network device transforming the protocol header comprises modifying a checksum value.

15. The method of claim 6, wherein the first device transmitting the test packet comprises the first device transmitting the test packet containing a first check value, the first check value being different from the check value in the packet received by the receiving device.

16. The method of claim 1, wherein comparing the check value of the received packet with the pre-loaded expected check value comprise comparing the check value of the received packet with the pre-loaded expected check value that is not generated from content of the received packet.

17. The method of claim 1, wherein receiving the packet comprises receiving the packet containing a splice value from a system under test, the splice value selected to cause the system under test to generate the check value in the packet that is equal to the pre-loaded expected check value.

18. A test device for receiving packets over a network, comprising:

a storage to store a pre-loaded expected check value;

an interface circuit to receive a packet containing a check value, the check value in the packet to enable verification of integrity of the packet; and a control circuit adapted to compare the check value in the packet with the pre-loaded expected check value.

19. The test device of claim 18, wherein the check value comprises a cyclic redundancy check value.

20. The test device of claim 18, wherein the interface circuit comprises an interface circuit adapted to communicate over an Ethernet network.

21. The test device of claim 18, wherein the control circuit is adapted to further perform an error detection based on the check value.

22. The test device of claim 21, wherein the check value comprises a cyclic redundancy check.

23. The test device of claim 18, wherein the pre-loaded expected check value is not generated from content of the received packet.

24. The test device of claim 18, wherein the pre-loaded expected check value is stored in the storage prior to the interface circuit receiving the packet.

25. The test device of claim 18, the interface circuit to receive the packet from a system under test, the packet containing a splice value to cause the system under test to generate the check value in the packet to be equal to the pre-loaded expected check value.

26. A test apparatus for receiving test packets over a network, comprising:
   an interface circuit adapted to receive the test packets, each containing a check value;
   a storage unit containing an expected check value; and
   a counter circuit receiving the expected check value and adapted to count test packets containing check values matching the expected check value.

27. The test apparatus of claim 26, wherein the storage unit is adapted to capture the contents of test packets failing to match the expected check value.

28. The test apparatus of claim 26, wherein the expected check value is pre-loaded in the storage unit, and the test apparatus further comprises a control circuit to compare the check value of each received test packet with the pre-loaded expected check value.

29. The test apparatus of claim 28, wherein the pre-loaded expected check value is not generated from content of the received test packets.

30. An article comprising at least one storage medium containing instructions for testing packets received from a network device, the instructions when executed causing a device to:
   store an expected check value;
   receive a packet containing a check value after storing the expected check value;
   perform an error check based on the check value in the received packet; and
   compare the check value in the received packet with the expected check value.

31. The article of claim 30, wherein the instructions when executed cause the device to compare the check value including a cyclic redundancy check value in the received packet with the expected check value including an expected cyclic redundancy check value.

32. The article of claim 30, wherein the expected check value is not generated from content of the received packet.

33. A data signal embodied in a carrier wave and comprising instructions for testing packets from a network device under test, the instructions when executed causing a device to:
   perform error checking based on a cyclic redundancy check value in a received packet; and
   compare the cyclic redundancy check value in the received packet with an expected cyclic redundancy check value to determine if content of the received packet is valid, wherein the expected cyclic redundancy check value is not generated from content of the received packet.

* * * * *